(12) United States Patent
Morimoto et al.

(10) Patent No.: US 7,821,207 B2
(45) Date of Patent: Oct. 26, 2010

(54) LIGHTING UNIT AND DISCHARGE LAMP

(75) Inventors: Etsuji Morimoto, Osaka (JP);
Kazuhiko Itou, Osaka (JP); Masayoshi Gyoten, Shiga (JP); Akira Takahashi, Osaka (JP)

(73) Assignee: Panasonic Corporation, Osaka (JP)

( * ) Notice: Subject to any disclaimer, the term of this patent is extended or adjusted under 35 U.S.C. 154(b) by 294 days.

(21) Appl. No.: 11/817,140

(22) PCT Filed: Mar. 2, 2006

(86) PCT No.: PCT/JP2006/303945

§ 371 (c)(1),
(2), (4) Date: Aug. 24, 2007

(87) PCT Pub. No.: WO2006/093215

PCT Pub. Date: Sep. 8, 2006

(65) Prior Publication Data

US 2009/0009091 A1    Jan. 8, 2009

(30) Foreign Application Priority Data

Mar. 2, 2005 (JP) ............................. 2005-058223
Mar. 1, 2006 (JP) ............................. 2006-055118

(51) Int. Cl.
*H01J 23/16* (2006.01)
(52) U.S. Cl. .............................. 315/32; 315/44; 315/50
(58) Field of Classification Search .................. 315/32,
315/35–37, 44, 49, 50, 51, 52, 56, 58, 59,
315/71, 88, 91, 101, 106, 107, 112, 114,
315/115, 116, 291, 309, 310
See application file for complete search history.

(56) References Cited

U.S. PATENT DOCUMENTS 4,735,823 A * 4/1988 Ito et al. .................. 427/79
5,841,238 A   11/1998 Van Veldhuizen et al.

(Continued)

FOREIGN PATENT DOCUMENTS

| JP | S52-9855 | 1/1977 |
|---|---|---|
| JP | 02-165532 | 6/1990 |
| JP | 9-129383 | 5/1997 |
| JP | 9-190891 | 7/1997 |
| JP | 10-189279 | 7/1998 |

(Continued)

*Primary Examiner*—Douglas W Owens
*Assistant Examiner*—Jianzi Chen

(57) ABSTRACT

Provided is a lighting unit and a discharge lamp each of which is capable of causing a capacitor to break down by heat generated in a heat generating component, so that circuit operation is safely terminated without any additional cost. A compact self-ballasted fluorescent lamp is provided with a lighting unit (50) housed in a case. The lighting unit (50) causes an arc tube to emit light and is composed of a plurality of electronic components, including a rectifier/smoothing circuit portion, an inverter circuit portion having transistors (Q1 and Q2), a resonant circuit portion, and a preheating circuit portion having a positive temperature coefficient element. Among the plurality of electronic components, the transistors (Q1 and Q2) and the positive temperature coefficient element generate excessive heat when, for example, the lamp is operated at the end of electrode's life. Capacitors (C4 and C6) disposed in the vicinity of the positive temperature coefficient element would break down by heat in a short mode.

17 Claims, 6 Drawing Sheets

U.S. PATENT DOCUMENTS

| | | | |
|---|---|---|---|
| 5,925,984 | A | 7/1999 | Fischer et al. |
| 6,134,132 | A | 10/2000 | Janssen et al. |
| 6,252,357 | B1 | 6/2001 | Tanaka et al. |
| 6,727,661 | B2 | 4/2004 | Kominami et al. |
| 2004/0090193 | A1* | 5/2004 | Rudolph et al. ............. 315/312 |
| 2004/0245939 | A1 | 12/2004 | Kitagawa et al. |

FOREIGN PATENT DOCUMENTS

| | | |
|---|---|---|
| JP | 11-003795 | 1/1999 |
| JP | 2000-077195 | 3/2000 |
| JP | 2000-82303 | 3/2000 |
| JP | 2002-015891 | 1/2002 |
| JP | 2002-043083 | 2/2002 |
| JP | 2002-519824 | 7/2002 |
| JP | 2003-100103 | 4/2003 |
| JP | 2003-208995 | 7/2003 |
| JP | 2004-303619 | 10/2004 |

* cited by examiner

FIG.7

| CAPACITOR | | CAPACITOR SURFACE TEMPERATURE | | CIRCUIT OPERATION | LAMP |
|---|---|---|---|---|---|
| | | NORMAL CAPACITOR | INTENTIONALLY BROKEN-DOWN CAPACITOR | | |
| FOIL TYPE | C5 | 100°C | ROOM TEMPERATURE | TERMINATED | OFF |
| | C8 | 100°C | ROOM TEMPERATURE | TERMINATED | OFF |
| | C6 | 110°C | 75°C | PREHEATING | OFF |
| EVAPORATED FILM TYPE | C5,C8 | 100°C | OVER 400°C | THERMAL FUSE MELTDOWN | OFF |

LIGHTING UNIT AND DISCHARGE LAMP

TECHNICAL FIELD

The present invention relates to a lighting unit for a lamp and also to a discharge lamp having the lighting unit. More specifically, the present invention relates to a lighting unit of an inverter type.

BACKGROUND ART

In response to the recent demand for energy savings, an increasing number of low-pressure mercury discharge lamps, which have high-efficiency and long rated life, are replacing conventionally used incandescent lamps.

A compact self-ballasted fluorescent lamp (hereinafter, referred to simply as a "lamp") is roughly composed of an arc tube, a lighting unit for operating the arc tube, and a resinous case for holding the arc tube and housing the lighting unit. At one end of the case is a base for attachment of the lamp to a socket of a lighting fixture. Power is supplied via the base from a commercial power source.

An exemplary lighting unit is of a so-called inverter type and is roughly composed of a rectifier/smoothing circuit portion having a diode bridge element and a smoothing capacitor, an inverter circuit portion having a pair of switching elements, and a resonant circuit portion having a choke coil and a resonant capacitor. Generally, the smoothing capacitor is constructed of an electrolytic capacitor, whereas the resonant capacitor is constructed of a film capacitor.

Each circuit portion of the lighting unit having the above structure is composed of a plurality of electronic components. In the event that any of electrodes of an arc tube or any electronic component (hereinafter, referred to simply as "heat generating component") undergoes an excessive temperature rise for some reason, the resulting heat may cause various problems, such as deformation, discoloration, and meltdown of the case.

In order to prevent occurrence of such problems, it is suggested to terminate the circuit operation upon abnormal heat generation of an electronic component. For example, Patent Document 1 listed below discloses a lighting unit in which a smoothing capacitor is disposed in the vicinity of a choke coil that would generate heat when an electrode of the arc tube approaches the end of its useful life. Thus, when the electrode of the arc tube comes to the end of its useful life, the choke coil generates heat and the resulting heat breaks down the electrolytic capacitor. As a result, the circuit operation stops.

In another example, Patent Document 2 also listed below discloses a lighting unit having a thermal fuse disposed in a circuit. The thermal fuse burns out at a predetermined temperature, so that operation of the lighting unit is terminated.

Patent Document 1: JP Patent Application Publication No. 2004-303619

Patent Document 2: JP Patent Application Publication No. 11-3795

DISCLOSURE OF THE INVENTION

Problems the Invention is Attempting to Solve

Yet, the inventors of the present invention have found the following problems associated with Patent Document 1. In accordance with Patent Document 1, the inventors of the present invention prepared a lighting unit in which a capacitor other than a smoothing capacitor (for example a resonant capacitor) was disposed in the vicinity of a heat generating component other than a chock coil. The capacitor was intentionally caused to break down by heat generated in the heat generating component. As a result, it is found that the temperature of the broken-down capacitor may still rise even after the lamp goes out. If the temperature rise is excessive, there is a risk that the case would be deformed, discolored, or melt.

It is also noted regarding Patent Document 2 that the provision of a thermal fuse that would burn out at a predetermined temperature improves the safety but with increase in cost. The above-noted problems are not limited to low-pressure mercury discharge lamps. Other types of lamps including high-pressure discharge lamps also suffer from similar problems.

The present invention is made in view of the above problems and aims to provide a lighting unit and a discharge lamp each of which is designed so that a capacitor breaks down by heat from a heat generating component. With such a lighting unit and a discharge lamp, it is ensured the circuit operation is safely terminated or brought into a safe state without any increase in cost.

Means for Solving the Problems

In order to achieve the above aim, one aspect of the present invention provides a lighting unit having a circuit composed of a plurality of electronic components for operating a lamp. The plurality of electronic components include one or more heat receiving capacitors and one or more heat generating components. Each heat receiving capacitor is configured to (i) perform a predetermined function during normal lamp operation and (ii) break down when raised to a predetermined temperature or higher responsive to heat from another of the electronic components, so that lamp operation is terminated or abnormal heat generation in said another electronic component is eliminated. Each heat generating component is configured to undergo an excessive temperature rise when the lamp is operated under a predetermined condition. At least one of the heat receiving capacitors is disposed close to or in contact with at least one of the heat generating components, so that said at least one heat receiving capacitor breaks down in a short-mode when raised to the predetermined temperature or higher.

As a result of diligent study, the inventors of the present invention have found that whether or not a broken-down capacitor would generate heat is determined by how the capacitor breaks down. That is, if the capacitor breaks down in a short-mode, the resistance of the capacitor is reduced substantially to zero and thus no heat is generated after the breakdown. On the other hand, if the capacitor breaks down in a manner to retain some resistance, the capacitor after the breakdown still passes a current and thus heat generation is inevitable.

According to the above structure, once the capacitor breaks down by heat from a heat generating component that is disposed close to or in contact with the heat generating component, the risk of heat generation by the capacitor is small even if the capacitor passes a current.

The wording "breakdown in the short-mode" refers to such breakage of a capacitor that the resulting resistance of the capacitor is reduced to approximately $2\Omega$ or less. Such breakage is also referred to as a "complete short".

Further, the wording "close to" refers to the arrangement that the heat receiving capacitor is disposed in the vicinity of the heat generating component. The distance between the heat receiving capacitor and the heat generating component is such that heat resulting from an excessive temperature rise of the heat generating component is conducted to the heat receiving capacitor to an extent that would cause the capacitor to break down. More specifically, the distance needs to be short enough to cause the heat receiving capacitor to break down by heat that is generated in the heat generating component under a predetermined condition, before the heat generating component catches fire or starts to smoke.

Consequently, the distance between the heat generating component and the heat receiving capacitor needs to be appropriately determined depending on the various factors including the type of an electronic component employed as the heat generating component, the size of electrodes supplied, and the heat-resistant temperature of the heat receiving capacitor.

Still further, the wording "lamp" used herein is not limited to a low- or high-pressure discharge lamp and includes a lamp employing, as a light source, a semiconductor lighting element such as LED.

The at least one heat receiving capacitor that is disposed close to or in contact with at least one of the heat generating components may be a foil-type capacitor. The lamp may be a discharge lamp. The circuit may include: a rectifier/smoothing circuit portion having a smoothing capacitor; an inverter circuit portion having a switching element; and a resonance circuit portion having a resonance capacitor. One of the heat generating components may be the switching element configured to undergo a temperature rise when the discharge lamp is operated under the predetermined condition that an electrode of the lamp is at an end of life. One of the heat receiving capacitors may be the resonance capacitor.

The wording "discharge lamp" used herein includes both low- and high-pressure discharge lamps within the scope.

The circuit may include a chock coil. The choke coil may be one of the heat generating components configured to undergo a temperature rise when the discharge lamp is operated under the predetermined condition that electrode of the lamp is at the end of life. The inverter circuit portion may include a snubber capacitor configured to protect the switching element. One of the heat receiving capacitors may be the snubber capacitor.

The inverter circuit portion may include at least two switching elements in total. The snubber capacitor may be disposed close to or in contact with at least one of the switching elements. The inverter circuit portion may be of a half-bridge type having a pair of coupling capacitors. At least one of the heat receiving capacitors may be one of the coupling capacitors.

The discharge lamp may be a low-pressure discharge lamp having filament electrodes. The circuit may include a positive temperature coefficient element configured to preheat one or both of the electrodes at startup of the low-pressure discharge lamp. One of the heat generating components may be the positive temperature coefficient element configured to undergo a temperature rise when the low-pressure discharge lamp is operated under the predetermined condition that either of the electrodes is at an end of life.

The wording "low-pressure discharge lamp" used herein includes a low-pressure mercury discharge lamp within the scope. The low-pressure mercury discharge lamp may be a compact self-ballasted fluorescent lamp as well as a lamp having an arc tube not provided with a phosphor layer.

The positive temperature coefficient element may be disposed close to or in contact with the resonance capacitor. The electronic components may be mounted on a substrate. In plan view of a mounting surface of the substrate, the choke coil may be located generally centrally of the mounting surface, the heat generating components may be located to surround the choke coil, and each heat receiving capacitor may be located at a position opposed to the chock coil relative to one of the heat generating components.

The circuit may include an electrolytic capacitor for smoothing. At least one of the heat receiving capacitors may be disposed close to or in contact with the electrolytic capacitor. The inverter circuit portion may include another capacitor that is not of a foil-type. At least one of the heat receiving capacitors may be disposed close to or in contact with said another capacitor. The circuit may include an inrush current limiting resistor. At least one of the heat receiving capacitors may be disposed close to or in contact with the inrush current limiting resistor. Regarding the wording "close to", the above description equally applies.

The heat receiving capacitors may be connected in parallel to the heat generating components. The heat receiving capacitors may be connected in parallel to a power source or to output after rectification or smoothing.

In another aspect, the present invention provides a discharge lamp comprising: an arc tube; a lighting unit configured to operate the arc tube; a tubular case configured to hold the arc tube and to house the lighting unit therein; and a base attached to an opposite end of the case from an end at which the arc tube is held. The lighting unit is as defined above.

As described above, the wording "discharge lamp" used herein includes both low- and high-pressure discharge lamps within the scope. In addition to the above description, the following description applies to the wording "close to". Being "close" refers to the arrangement that the distance between the heat receiving capacitor and the heat generating component is such that the heat receiving capacitor breaks down by heat generated in the heat generating component, before the case of the discharge lamp housing the lighting unit starts to deform by the heat.

The arc tube may be made of a glass tube having a double-spiral shape. In the lighting unit, each heat receiving capacitor that may be disposed close to or in contact with at least one of the heat generating components is located between the case and said at least one of the heat generating components.

EFFECTS OF THE INVENTION

The lighting unit according to the present invention is configured as follows. Under a predetermined condition, a heat generating component undergoes a temperature rise. The resulting heat is conducted from the heat generating component to a heat receiving capacitor and eventually causes the heat receiving capacitor to break down in the short-mode.

With the above configuration, when a "discharge lamp" is operated under the condition, for example, where "either of the electrodes approaches the end of its life" or where "the discharge lamp is mistakenly attached to and operated with a dimmable lighting fixture", the heat generating component generates excessive heat and the heat causes breakdown of the heat receiving capacitor disposed close to or in contact with the heat generating component.

Similarly, the heat receiving capacitor breaks down by abnormal heat that is generated in the heat generating component, if the lamp is operated under the condition, for example, where "an electronic components remains defective" or where "the power source remains ON even if the lamp is no longer able to illuminate."

Since the breakdown under the above conditions occurs in the short-mode, a current flow in the capacitor after the breakdown is not likely cause heat generation. Consequently, if the lamp is operated under the predetermined condition and goes off because of breakdown of a heat receiving capacitor, the risk of heat generation after the breakdown is small. In this way, the safety after breakdown of a heat receiving capacitor improves. In addition, the safety improvement is achieved without requiring additional electronic components such as a thermal fuse.

Furthermore, since it is not likely that a heat receiving capacitor generates heat after breakdown, it is possible to dispose one or more capacitors near the peripheral wall of the case that houses the lighting unit. As a result, the space present within the case can be more effectively used, which permits further size reduction of the case.

BRIEF DESCRIPTION OF THE DRAWINGS

FIG. 7 is a table of measurement results on heat generation by each capacitor of the lamp according to the present invention.

REFERENCE NUMERALS

1 Lamp
10 Arc Tube
20 Holder
30 Case
40 Base
50 Lighting Unit
51 Substrate
L Choke Coil
CD1, CD2 Electrolytic Capacitor
C4 Snubber Capacitor
C5, C8 Coupling Capacitor
C6 Resonant Capacitor
P2 Inrush Current Limiting Resistor
PTC Positive Temperature Coefficient Element
Q1, Q2 Transistor

BEST MODE FOR CARRYING OUT THE INVENTION

1. Overall Structure of Lamp

Figure 1:
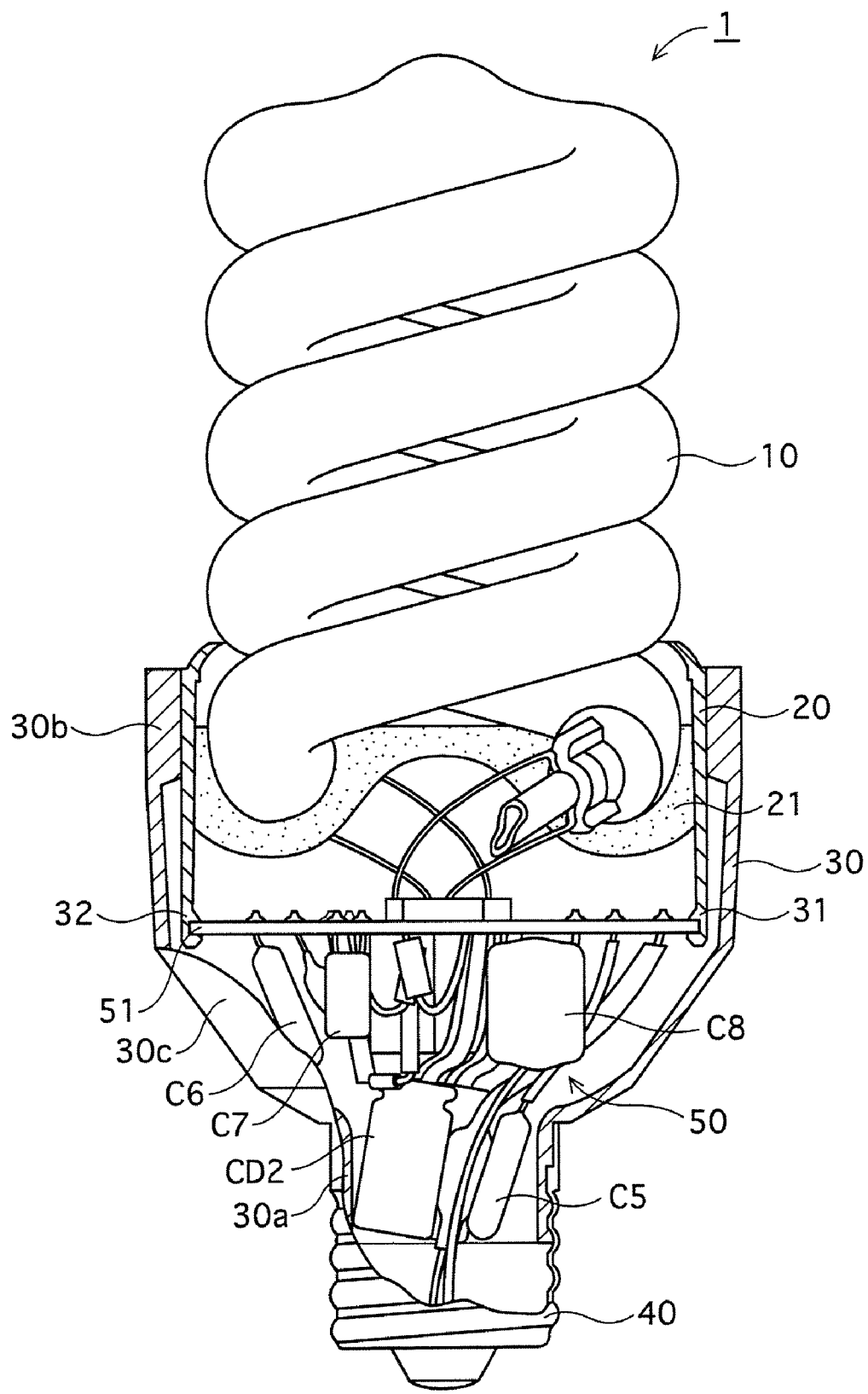
FIG. 1 is a partial cross-sectional view of a lamp according to an embodiment of the present invention, as seen from a side.

FIG. 1 is a cross-sectional view of a lamp 1 according to an embodiment of the present invention, as seen from the side. In addition, FIG. 1 is partly broken away to better show internal details. The lamp 1 illustrated in FIG. 1 is a 12-watt lamp, which is a replacement for a 60-watt incandescent lamp.

As illustrated in FIG. 1, the lamp 1 is roughly composed of an arc tube 10 defining a double-spiral discharge path, a holder 20 for holding the arc tube 10, a lighting unit 50 for causing the arc tube 10 to emit light, a case 30 disposed to house the holder 20 and the lighting unit 50 therein, and a base 40 attached to one end of the case 30. Note that the holder 20 and the case 30 together constitute the "case" according to the present invention.

The arc tube 10 is composed of a glass tube (having an outside diameter of 9.0 mm, for example) that is made from soft glass. The glass tube is so processed to have a bend at a substantially middle thereof and two spiral portions that are wound from the bend toward the respective ends around an axis that passes through the bend.

The arc tube 10 has a pair of electrodes (not illustrated) each made of a filament. The electrodes are disposed inside the art tube 10 (i.e., within the discharge path) and one at each end of the arc tube 10 (i.e., at each end of the glass tube). The distance between the electrodes within the discharge path (i.e., the discharge path length) is designed to be 400 mm, for example. The inner surface of the arc tube 10 is coated with a phosphor layer and the discharge path is filled with mercury and a gas mixture of Ar and Ne, for example.

The holder 20 is made from a resin such as PET (polyethylene terephthalate) and has insertion holes (not illustrated) for receiving the ends of the arc tube 10. Each insertion hole is shaped to conform to a portion of the arc tube 10 close to the electrode. The arc tube 10 is secured relatively to the holder 20 with a resin 21, in the state where the portions of the arc tube 10 close to the electrodes are inserted into the respective insertion holes of the holder 20. The resin 21 may be silicon.

The case 30 is made, for example, from PBT (polybutylene terephthalate). The case 30 is composed of a small diameter portion 30a, a large diameter portion 30b that is diametrically larger than the small diameter portion 30a, and a tapered portion 30c having a gradually increasing diameter to connect the small diameter portion 30a and the large diameter portion 30b. That is to say, the portions 30a, 30b, and 30c together define a funnel shape.

The holder 20 is attached to the inner peripheral surface of the large diameter portion 30b of the case 30. The base 40 is attached to the outer peripheral surface of the small diameter portion 30a of the case 30. Although the holder 20 in this embodiment is attached at the outer peripheral surface to the large diameter portion 30b of the case 30, the case and the holder may be an integral piece. That is, the case according to the present invention may be of any other types as long as such a case holds the arc tube in place, has a small diameter portion to which the base is attached, and houses the lighting unit therein.

The base 40 may be composed of a metal pipe having a screw-threaded peripheral wall. In this embodiment, an E17 base is employed, but this is merely by way of example and without limitation. The base 40 may be an E26 base or even a B-type base.

The lighting unit 50 is roughly composed of a substrate 51 having a predetermined pattern formed on a main surface thereof and a plurality of electronic components mounted on the substrate 51. As illustrated in FIG. 1, the lighting unit 50 is secured within the case 30, by latching members 31 and 32 of the holder 20 engaging with the outer peripheral edge of the substrate 51.

2. Circuitry of Lamp

Figure 2:
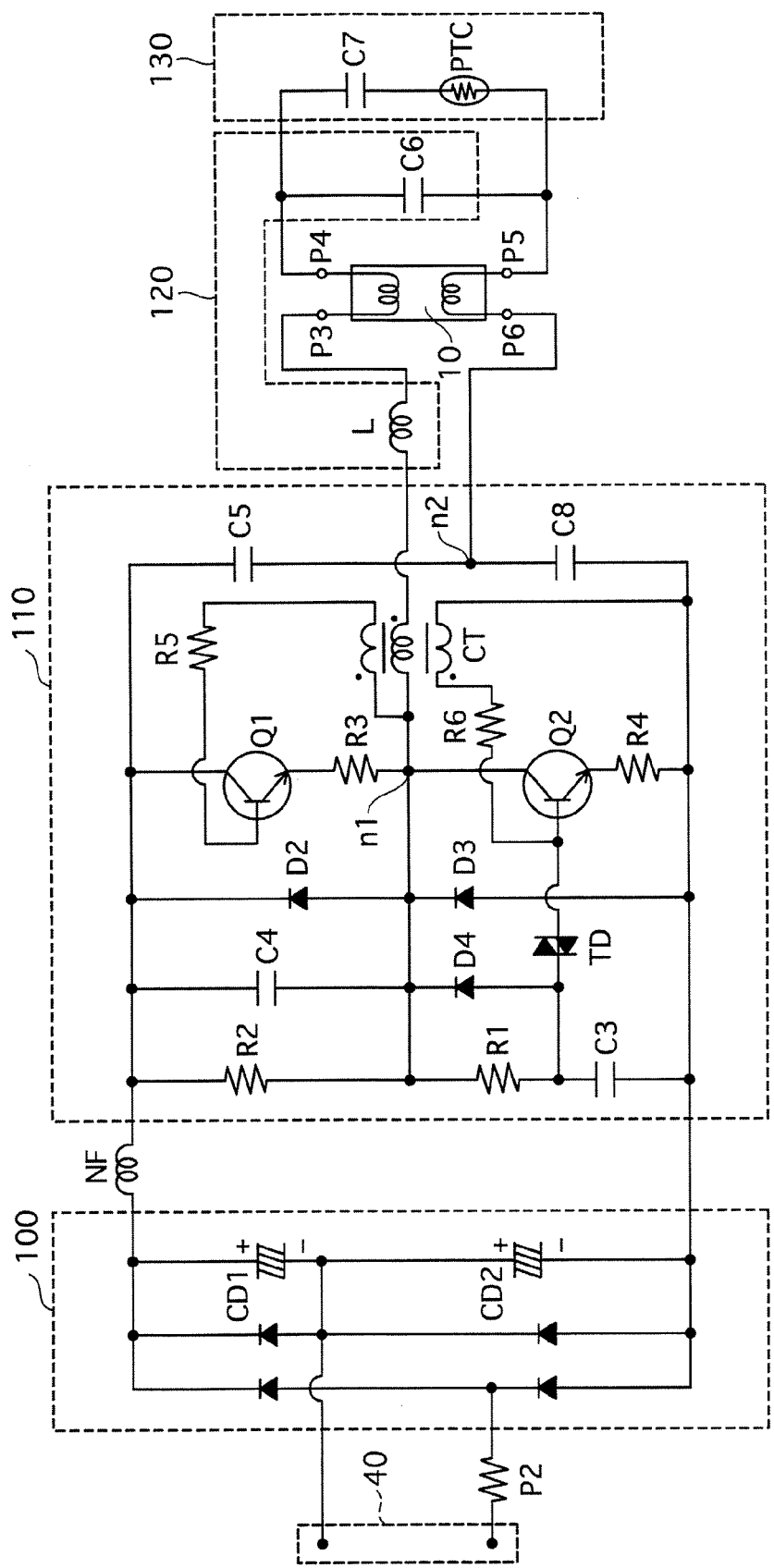
FIG. 2 is a circuit diagram of the lamp having a lighting unit.

FIG. 2 is a diagram showing the circuitry of the lamp 1 having the lighting unit 50.

The lighting unit 50 is mainly composed of a rectifier/smoothing circuit portion 100, an inverter circuit portion 110, a resonant circuit portion 120, and a preheating circuit portion 130.

The rectifier/smoothing circuit portion 100 converts, by rectifying and smoothing, a commercially available low-frequency alternating current into a direct current. The rectifier/smoothing circuit portion 100 is roughly composed of a diode bridge and electrolytic capacitors CD1 and CD2. Since a voltage multiplier is employed, the output voltage of the rectifier/smoothing circuit portion 100 is approximately equal to 2.8 times the input voltage (effective value). For example, when the voltage (effective value) of a commercial power source is 100 V, the output voltage of the rectifier/smoothing circuit portion 100 is approximately 280 V.

The lighting unit 50 is connected to a commercial power source via the base 40. In addition, an inrush current limiting resistor P2 is connected between the base 40 and the rectifier/smoothing circuit portion 100. More specifically, the inrush current limiting resistor P2 is connected at an input end of the rectifier/smoothing circuit portion 100.

The inverter circuit portion 110 is of a so-called half-bridge type and is roughly composed of a pair of transistors Q1 and Q2 (each of which is equivalent to a "switching element" according to the present invention) and two coupling capacitors C5 and C8. For the coupling capacitors C5 and C8, foil-type film capacitors such as polyester film capacitors are employed. The specifications of each coupling capacitor are such that the capacitance is 47 nF and the rated voltage is 250 V.

The inverter circuit portion 110 operates to alternately turn ON the transistors Q1 and Q2, so that a high-frequency voltage (50 kHz, for example) is supplied to loads (the resonant circuit portion 120, the preheating circuit portion 130, and the arc tube 10) connected between the connection nodes n1 and n2.

The switching operation of the transistors Q1 and Q2 is carried out by a current transformer CT. The current transformer CT has one primary coil and two secondary coils. In the secondary coils, a voltage is induced in the direction and magnitude responsive to the load current flowing through the primary coil.

With the circuit arrangement illustrated in FIG. 2, the load current that flows through the primary coil during the ON period of the transistor Q1 induces a voltage in the secondary coil, so that the transistor Q1 is turned OFF and the transistor Q2 is turned ON instead. On the other hand, the load current that flows through the primary coil during the ON period of the transistor Q2 induces a voltage in the secondary coil, so that the transistor Q2 is turned OFF and the transistor Q1 is turned ON instead.

The switching operation is initiated by a starting circuit that is roughly composed of resistors R1 and R2, a starting capacitor C3, and a trigger diode TD. In the starting circuit, the resistors R1 and R2 and the starting capacitor C3 are connected in series. The connection node between the resistor R1 and the starting capacitor C3 is connected to the base of the transistor Q2 via the trigger diode TD.

As the starting capacitor C3, a foil-type film capacitor such as a polyester film capacitor is employed. The specifications of the capacitor may be such that the rated voltage is 100 V.

Once the switching operation starts, the transistors Q1 and Q2 are made to alternately turn ON and OFF in response to the output voltage of the current transformer CT. For each transistor to be turned OFF, a predetermined time that is unique to the respective switching element is required. In addition, the current flowing immediately before the switching passes into a choke coil L (inductance) after the switching. This delays the switching timing of the current from the switching timing of voltage. Due to the delay, the loss of the transistors Q1 and Q2 increases significantly. The snubber capacitor C4 is provided in order to suppress such switching loss and to protect the transistors Q1 and Q2.

As the snubber capacitor C4, a foil-type film capacitor such as a polyester film capacitor is employed. The specifications of the capacitor may be such that the capacitance is 1 nF and the rated voltage is 1.2 kV.

In addition, since a large amount of the pulsed current flows through the snubber capacitor C4, it is applicable to employ a polypropylene film or a combination of polypropylene and polyester films as the snubber capacitor C4 to increase the resistance to the pulsed current. Generally, a polypropylene film has a relatively low heat resistance up to 80° C.-105° C. or to 125° C. Thus a polypropylene film is applicable as the heat receiving capacitor according to the present invention.

The inverter circuit portion 110 is connected to the rectifier/smoothing circuit portion 100 via a filter coil NF that reduces switching noise caused by the transistors Q1 and Q2. With this arrangement, an LC filter is constituted by the filter coil NF and the coupling capacitors C5 and C8, so that the switching noise is prevented from entering the commercial power source.

The resonant circuit portion 120 is roughly composed of the choke coil L and the resonant capacitor C6 that are serially connected. The resonant circuit portion 120 supplies a preheating current to the filament electrodes and increases the voltage across the filament electrodes. As the resonant capacitor C6, a foil-type film capacitor such as a polyester film capacitor is employed. The specifications of the capacitor may be such that the capacitance is 1 nF and the rated voltage is 1.2 kV.

The preheating circuit portion 130 is connected to the resonant capacitor C6 in parallel and includes an auxiliary capacitor C7 and a positive temperature coefficient element PTC that are serially connected. The auxiliary capacitor C7 reduces the resonant frequency of the resonant circuit portion 120 at the early stage of the lamp startup. The positive temperature coefficient element PTC adjusts the current supplied to the auxiliary capacitor C7.

As the auxiliary capacitor C7, a foil-type film capacitor such as a polyester film capacitor is employed. The specifications of the capacitor may be such that the rated voltage is 1.2 kV. In addition, the positive temperature coefficient element PTC employed in this embodiment has the resistance of 1.0 kΩ at inflection point 85° C. This structure allows adjustment of both the preheating current and the preheating time to fall within predetermined ranges, in conformity with the circuits constituting the lighting unit 50 and the arc tube 10. Note that if the preheat setting is appropriately made, the auxiliary capacitor C7 may not be used.

3. Operation

The following briefly describes operation of the lamp 1, with reference to FIG. 2.

The lighting unit 50 is supplied with an alternating current from a commercial power source via the base 40. The alternating current is converted into a direct current by the rectifier/smoothing circuit portion 100 and the resulting direct current is output to the inverter circuit portion 110. In response, the voltage across the starting capacitor C3 increases with a predetermined time constant. The time constant is determined depending on the resistances of the resistors R1 and R2 and the capacitance of the starting capacitor C3. When the voltage across the starting capacitor C3 exceeds the break over voltage of the trigger diode TD, the voltage across the starting capacitor C3 is applied to the base of the transistor Q2 to turn ON the transistor Q2. This starts the switching operation.

Thereafter, a high-frequency voltage is applied to the resonant circuit portion 120, the preheating circuit portion 130, and the arc tube 10. In addition, a current is supplied to the positive temperature coefficient element PTC. With increasing temperature of the positive temperature coefficient element PTC, the resonant frequency of the resonant circuit portion 120 decreases. Consequently, a high voltage is applied across the electrodes and eventually causes dielectric breakdown between the electrodes. As a result of the dielectric breakdown, a current flows across the electrodes to turn ON the lamp.

4. Locations of Electronic Components

Figure 3:
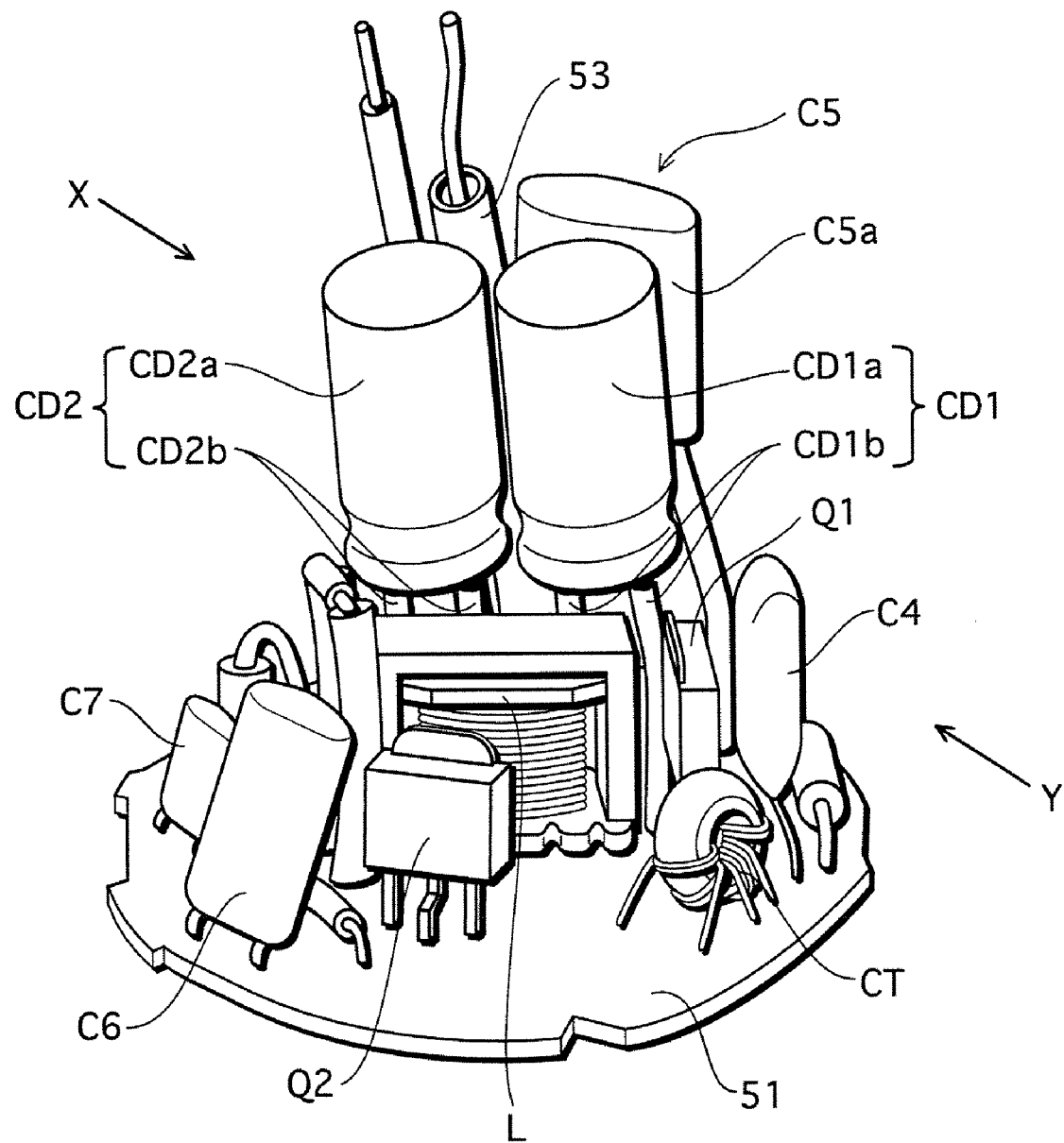
FIG. 3 is an oblique view of the lighting unit showing the arrangement of electronic components.
Figure 4:
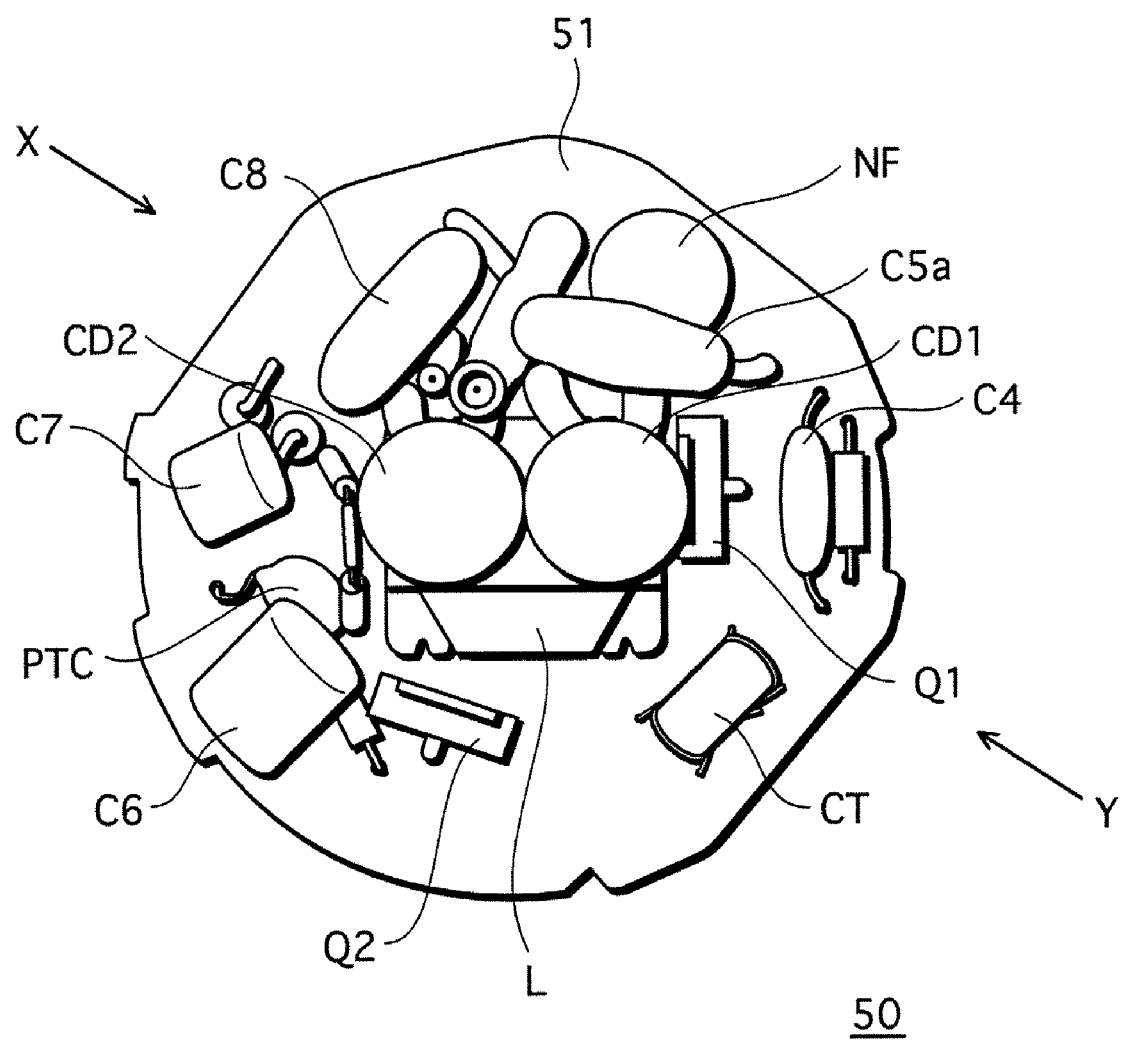
FIG. 4 is a plan view of the lighting unit.
Figure 5:
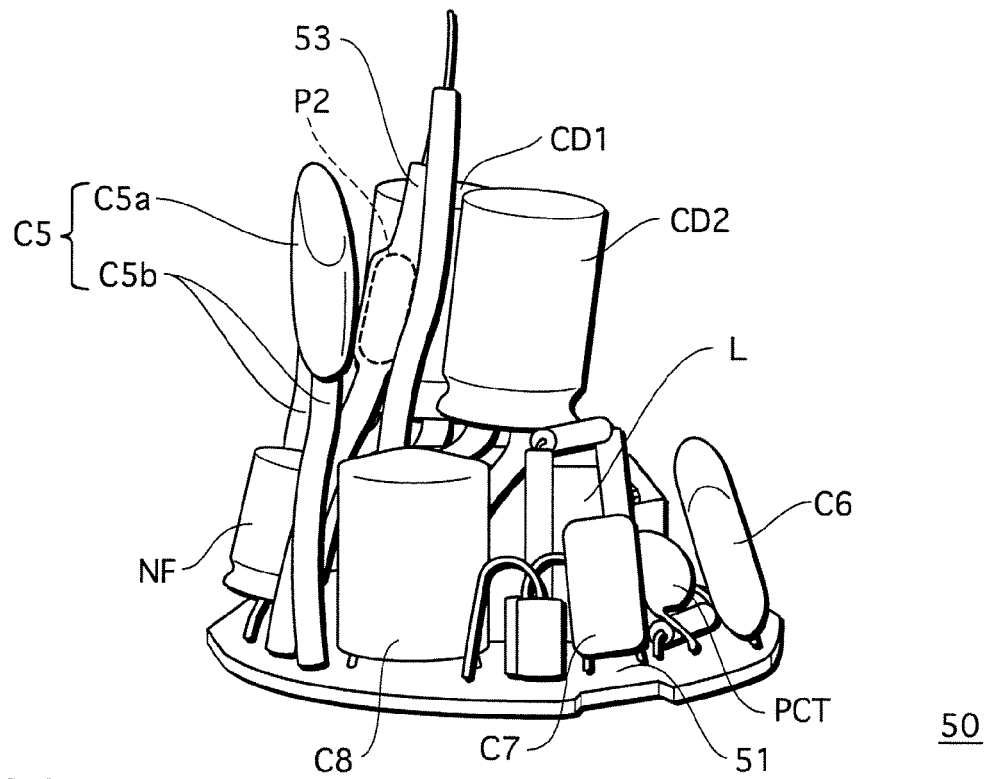
FIG. 5 is a view of the lighting unit, as seen from the X direction of FIGS. 3 and 4.
Figure 6:
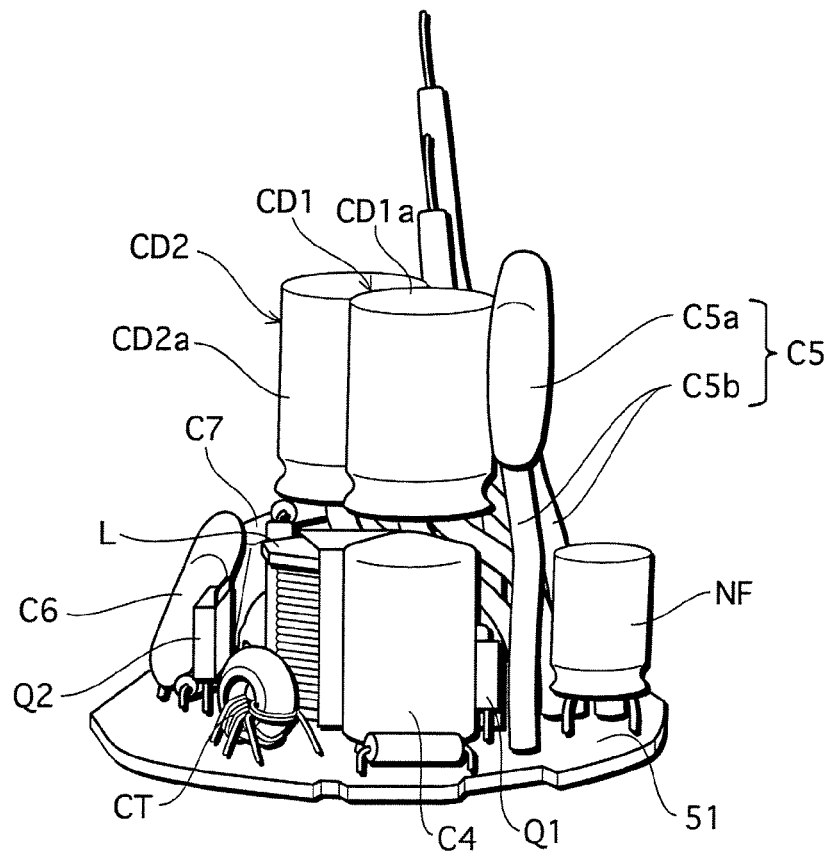
FIG. 6 is a view of the lighting unit, as seen from the Y direction of FIGS. 3 and 4.

FIG. 3 is an oblique view of the lighting unit. FIG. 4 is a plan view of the lighting unit. FIG. 5 is a view illustrating the lighting unit, as seen from the X direction of FIGS. 3 and 4. FIG. 6 is a view illustrating the lighting unit, as seen from the Y direction of FIGS. 3 and 4. With reference to FIGS. 3-6, the following describes the electronic components constituting the lighting unit.

The lighting unit 50 is composed of a plurality of electronic components constituting the above-described circuit portions mounted on the substrate 51.

In plan view, the choke coil L is located centrally on the substrate 51. The electrolytic capacitors CD1 and CD2 are mounted so that the main bodies CD1a and CD2a of the respective electrolytic capacitors CD1 and CD2 are positioned above the choke coil L.

A pair of lead wires CD1b and CD2b extend from the main bodies CD1a and CD2a of the electrolytic capacitors CD1 and CD2. Each of the lead wires CD1b and CD2b has at least one bend so as to place the main bodies CD1a and CD2a above the choke coil L.

In plan view, as illustrated in FIG. 4, the transistors Q1 and Q2 and the positive temperature coefficient element PTC are located to surround the choke coil L. These electronic components (Q1, Q2, and PTC) generate excessive heat when, for example, either of the electrodes of the arc tube 10 comes to the end of the useful life (that is, these electronic components are examples of heat generating components according to the present invention).

In the vicinity of the transistor Q1 is the snubber capacitor C4. More specifically, the snubber capacitor C4 is located between the peripheral edge of the substrate 51 and the transistor Q1 and in the vicinity of the transistor Q1.

In plan view as illustrated in FIG. 4, the "outside of the transistor Q1" refers to such a location that is on the line segment extending from the center of the substrate 51 across the center of the transistor Q1 and that is between the peripheral edge of the substrate 51 and a surface of the transistor Q1 facing toward the peripheral edge of the substrate 51. Similarly, the "inside of the transistor Q1" refers to such a location that is on the above-mentioned line segment and that is between the center of the substrate 51 (or a neighboring position of the center of the substrate 51) and a surface of the transistor Q1 facing away from the peripheral edge of the substrate. The above definitions apply also to the inside and outside of other components. Thus, with use of the wording "inside" and "outside", the snubber capacitor C4 is described to be located in the outside vicinity of the transistor Q1.

On the outside of the positive temperature coefficient element PTC, the resonant capacitor C6 and the auxiliary capacitor C7 are disposed as illustrated in FIGS. 4 and 5. Each distance between the transistor Q1 and the snubber capacitor C4, between the positive temperature coefficient element PTC and the resonant capacitor C6, and between the positive temperature coefficient element PTC and the auxiliary capacitor C7 needs to be short enough, so that the respective one of the capacitors (C4, C6, and C7) breaks down by heat generated as a result of the temperature rise of the transistor Q1 or the positive temperature coefficient element PTC, before the case 30 starts to deform by the heat. The transistor Q1 and the positive temperature coefficient element PTC generate heat when either electrode of the arc tube 10 approaches the end of its useful life.

A life test was conducted on a 12-watt lamp according to the present invention. The distance L between the positive temperature coefficient element PTC and the resonant capacitor C6 as well as between the positive temperature coefficient element PTC and the auxiliary capacitor C7 were within the range of 0-2.5 mm. The positive temperature coefficient element PTC was intentionally caused to break down before the life test. Several hours after the test started, the positive temperature coefficient element PTC broke down and went into the preheating condition. In the preheating condition, the positive temperature coefficient element PTC constantly consumed 8-9 watts of power. Even after 13,000 hours, neither the case 30 nor the other components exhibited discoloration or deformation and maintained in a safe state without such problems. After the test, it was confirmed that the resonant capacitor C6 alone or both the capacitors C6 and C7 had been completely shorted out, and the positive temperature coefficient element PTC had been deteriorated by heat.

As described above, the positive temperature coefficient element PTC after breakdown is maintained at temperatures in the range ambient to 400° C. Yet, with the arrangement in which the positive temperature coefficient element PTC and the resonance capacitor C6 are located close to each other, the positive temperature coefficient element PTC temporarily rises up to about 400° C. after breakdown. Yet, the resulting heat increases the temperature of the capacitor C6 (or of the capacitors C6 and C7), so that the resonant capacitor C6 alone or both the capacitors C6 and C7 would break down by completely shorting out.

As a result, the current in the positive temperature coefficient element PTC is by-passed via the resonant capacitor C6 having been shorted out. As a result, the current in the positive temperature coefficient element PTC is reduced to zero, so that no heat is generated thereafter.

In the event that the auxiliary capacitor C7 breaks down before the resonant capacitor C6, a larger voltage is applied to the positive temperature coefficient element PTC. Consequently, the positive temperature coefficient element PTC generates more heat and thus the temperature of the resonant capacitor C6 increases more rapidly. As a result, breakdown of the resonant capacitor C6 is accelerated.

In the event that the auxiliary capacitor C7 breaks down before the resonant capacitor C6, the resonant capacitor C6 would break down at about 200° C. within the short time period. Thus, resinous components such as the case 30 are without the risk of discoloration or deformation even if the positive temperature coefficient element PTC generates excessive heat. It is because the resinous components are disposed farther away from the positive temperature coefficient element PTC than the resonant capacitor C6 is (the distance between such a resinous component and the positive temperature coefficient element PTC is greater than the distance between the capacitor C6 and the positive temperature coefficient element PTC). It is also because the resinous components has a relatively large heat capacity. Generally, the resinous components, including the case 30, of the lamp 1 have the thermal deformation temperature of 210° C. or higher.

Another life test was conducted on a lamp in which the snubber capacitor C4 and the transistor Q1 were disposed at a distance of 0-1.0 mm. The loss of the transistors was intentionally caused to increase to raise the temperature of the transistor Q1 to 200° C. or higher. Five minutes to three hours later, the snubber capacitor C4 reached the temperature of 200° C. and broke down. As a result, the inrush current limiting resistor P2 opened and the circuit operation stopped.

Normally, before the transistors Q1 and Q2 reach the temperature of 200° C., components other than the transistors Q1 and Q2 (such as electrolytic capacitors CD1 and CD2 and the filament electrodes) or the transistors Q1 and Q2 would break down to open the inrush current limiting resistor P2. Yet, on rare occasion, the transistors Q1 and Q2 keep operating for a short while at the temperature of 220° C.

Even if the transistors Q1 and Q2 operate at such a high temperature, the heat of the transistors Q1 and Q2 is conducted to the snubber capacitor C4, so that the snubber capacitor C4 breaks down before the heat is conducted to the resinous components. Thus, the circuit operation is terminated safely and relatively immediately upon abnormal heat generation.

The coupling capacitor C5 is disposed in the outside vicinity of the electrolytic capacitors CD1 and CD2. More specifically, with reference to the mounting surface of the substrate 51, the main body C5a of the coupling capacitor C5 is generally at the same height with the main bodies CD1 and CD2 of the electrolytic capacitors CD1 and CD2. In addition, the coupling capacitor C5 is disposed in the outside vicinity of the that the main bodies CD2a and CD2a.

The coupling capacitor C8 is mounted on the substrate 51 at a position outside the choke coil L. More specifically, the coupling capacitor C8 is disposed close to a portion of the double-spiral arc tube 10 that is inserted within the holder 20, especially to a portion corresponding to where the electrode is disposed. In the example of the 12-watt lamp 1 illustrated in FIG. 1, the distance between the electrode of the arc tube 10 and the coupling capacitor C8 falls within the range of 10-20 mm.

5. Abnormal Operation of Lamp

When the arc tube 10 of the lamp 1 having the above structure comes to the end of its useful life, the voltage across the arc tube 10 elevates generally because the emitters are nearly exhausted by that time. As a result, the input power increases, so that the resonant current in the circuits increases. Eventually, the discharge occurring in the arc tube 10 can no longer be maintained, so that the lamp produces lower light output, flickers, or repeats fading-out and re-starting, which results in blinking of light.

When the lamp 1 restarts during blinking, the resonant circuit portion 120 produces series resonance. Thus, a high voltage and a large amount of current is supplied to the resonant capacitor C6. In addition, a high voltage is supplied also to the preheating circuit portion 130. As the impedance of the resonant circuit portion 120 is further reduced, the load current of the inverter circuit portion 110 increases.

Consequently, the temperature starts to rise in each of the transistors Q1 and Q2 of the inverter circuit portion 110, the choke coil L of the resonant circuit portion 120, the positive temperature coefficient element PTC of the preheating circuit portion 130. At the same time, input power increases with the temperature rise. Thus, the inrush current limiting resistor P2 also increases in temperature as well as in resonance within the circuit. As a result, the temperature of the electrolytic capacitors increases, along with the temperature of the electrodes of the arc tube 10.

Now, the following is a specific description of the temperature of the heat generating components observed at the time when either electrode approaches the end of its useful life. When the positive temperature coefficient element PTC breaks down due to the excessive voltage, the temperature of the positive temperature coefficient element PTC rises to 400° C. or higher and the temperature of the transistors Q1 and Q2 rises to about 280° C.

Regarding the other heat generating components, the electronic components constituting the inverter circuit portion 110, the resonant circuit portion 120, and the preheating circuit portion 130 also experience a temperature rise caused by overcurrent and other factors. Yet, the temperature rise of the transistors Q1 and Q2 and the positive temperature coefficient element PTC is especially notable. As described above, the temperature rise in each electronic component differs from one another due to various factors, including the characteristics of the electronic component, the functions of the electronic component in the respective circuit, and the packaging density on the substrate, and the path of a current flow.

In the vicinity of each of the transistor Q1 and the positive temperature coefficient element PTC, both of which are the heat generating components, a foil-type film capacitor (corresponding to a "heat receiving capacitor" of the present invention) is disposed. More specifically, the snubber capacitor C4 is disposed in the vicinity of the transistor Q1, whereas the resonant capacitor C6 is disposed in the vicinity of the positive temperature coefficient element PTC. When the transistor Q1 and the positive temperature coefficient element PTC generate heat, the heat is conducted to the snubber capacitor C4 and the resonant capacitor C6.

In addition, when the transistor Q1 and the positive temperature coefficient element PTC generate heat to approach the temperate that would thermally deform the case 30 housing the lighting unit 50 (if the case 30 is made from PBT, the thermal deformation starts at about 240° C.), the heat is conducted to the snubber capacitor C4 and the resonant capacitor C6 located in the vicinity of the heat generating components. As a result, at least either of the snubber capacitor C4 and the resonant capacitor C6 breaks down within e.g. 1.5 minutes after the temperature of the capacitor reaches e.g. 200° C.

In other words, since the snubber capacitor C4 and the resonant capacitor C6 are constituted by foil-type film capacitors, at least either of the snubber capacitor C4 and resonant capacitor C6 would be thermally deteriorated and break down at 200° C., for example. This breakdown is a short-mode breakdown.

Consequently, even if a current flow remains in a circuit after the capacitor breaks down, there is no risk of heat generation because the resistance of the capacitor after the short-mode breakdown is substantially equal to 0Ω.

The following describes the circuit operation after the capacitor breakdown.

In the event that the snubber capacitor C4 breaks down, an overcurrent is supplied to the transistor Q2 via the broken-down snubber capacitor C4, thereby causing the transistor Q2 to break down. As a result, the circuit operation is terminated.

On the other hand, in the event that the resonant capacitor C6 breaks down, the transistors Q1 and Q2 continue the switching operation but the voltage across the filament electrodes decreases. Thus, the discharge is no longer maintained and the lamp goes out. Yet, a current flow still remains in the circuit, so that the filament electrodes will eventually melt down (i.e., burn out) because of the preheating current. This brings an end to the circuit operation.

As described above, the capacitor C5 is located in the vicinity of the main bodies CD1a and CD2a of the electrolytic capacitors CD1 and CD2. When the lamp comes to the end of its useful life or when an input power increases, the low-frequency ripple current flowing through the electrolytic capacitors CD1 and CD2 increases. In addition, the resonance of the inverters increases. As a result, the high-frequency ripple current of the capacitor C5 increases and the temperature of the capacitor C5 rises.

It should be noted, in addition, that the electrolytic capacitors CD1 and CD2 have the rated life that is shortest among all the electronic components of the lighting unit 50. The rated life of the electrolytic capacitors CD1 and CD2 is approximately equal to the rated life of the arc tube. Thus, by the time the arc tube comes to the end of the useful life, the electrolytic solution in the electrolytic capacitors CD1 and CD2 have decreased and the equivalent series resistance has significantly increased.

In synergy with the temperature rise caused by the increase in high-frequency ripple current, the temperature of the electrolytic capacitors CD1 and CD2 further elevates. Responsive to the elevated temperature, the foil-type coupling capacitor C5 undergoes a temperature rise and deteriorates from the high voltage at a faster speed. Eventually, such a high temperature causes a short-mode breakdown of the foil-type coupling capacitor C5. In this event, the coupling capacitors C5 and C8 are no longer capable of accomplishing their functions. That is, no more oscillation is produced and thus the circuit no longer works.

According to the present invention, in addition, the coupling capacitor C5 is disposed so that the main body C5a is spaced above the substrate 51, whereas the coupling capacitor C8 is disposed so that the main body is located closer to the substrate 51.

If the inverter circuit portion 110 is of a half-bridge type, the amount of current flowing through the coupling capacitor C5 is slightly larger than the amount of current flowing through the coupling capacitor C8. This is because much of the current in the coupling capacitor C8 passes through the filter coil NF.

For this reason, the coupling capacitor C5 is normally increased to a temperature higher than that of the coupling capacitor C8. Yet, the coupling capacitor C5 is disposed at such a location where the ambient temperature is relatively lower (i.e., a location spaced above the substrate 51) owing to this arrangement, the coupling capacitors C5 and C8 are made closer to each other in the temperatures at the time of actual operation. Thus, the same types of capacitors may be employed as the coupling capacitors C5 and C8 and the both are still comparable to each other in rated life and function of terminating the circuit operation. This allows a low cost manufacturing of the lighting unit.

The coupling capacitor C8 is mounted on the substrate 51 at a location outside of the choke coil L. More specifically, the coupling capacitor C8 is located in the vicinity of a portion of the double-spiral arc tube 10 inserted into the holder 20. The coupling capacitor C8 is especially close to a portion of the arc tube 10 where either of the electrode is located.

Owing to this arrangement, the temperature of the filament coils elevates when the arc tube 10 comes to the end of the useful life. It is because the emitters mixed into the filament electrodes evaporate out at the end of lamp life and the loss at the filament electrodes increases significantly. In addition, the temperature of the choke coil L also rises for the above stated reason. Because of the heat generated through the filament electrodes and the choke coil L, the temperature of the coupling capacitor C8 increases. In addition, by the end of life (after a long period of use), the film capacitors have been deteriorated with time. With the increased temperate and the deterioration with time, the coupling capacitor C8 would break down and short out at about 150° C. As a result, it is ensured that the circuit operation is safely terminated more promptly.

6. Temperature Measurements of Electronic Components after Capacitor Breakdown FIG. 7 is a table showing the results of measurements conducted to check the heat generated in the capacitors of the lamp 1 according to the present invention.

The inventors of the present invention prepared samples of the lamp 1 having the lighting unit 50 housed in the case 30. Some of the samples were provided with coupling capacitors C5 and C8 and resonant capacitor C6 maintained at the normal condition, whereas the rest of the samples were provided with the capacitors C5, C8, and C6 each of which was intentionally caused to break down. Each samples of the lamp 1 was supplied with power, and the surface temperatures of the main bodes of the capacitors C5, C8, and C6 were measured.

To measure the surface temperature, each sample was provided with an insertion hole provided in the peripheral wall of the case 30. A thermocouple was inserted into the insertion hall and a probe of the thermocouple was sequentially brought into intimate contact with the outer surfaces of each capacitor's main body to measure the temperate. Note that the capacitors were caused to break down by applying an overvoltage and an overcurrent with use of a withstand voltage testing device (AC voltage), a high-voltage source (DC voltage), and a pulse generator (pulsed current). It is known in the art that the application of an overvoltage and an overcurrent causes a short-mode breakdown similarly to a breakdown caused by heat.

a. Coupling Capacitors C5 and C8

In the above described manner, the temperatures of the coupling capacitors C5 and C8 were measured. Regarding the coupling capacitors C5 and C8, the measurement results on the normal products is 100° C., whereas the measurement results on the intentionally failed products is equal to a room temperature. Yet, since the capacitors of the intentionally failed products completely shorted out, no surface temperature rise was observed in the coupling capacitors C5 and C8. In addition, since the operation of the lighting unit 50 was terminated, no temperature rise was observed in the other electronic components either. That is, the surface temperatures of the coupling capacitors C5 and C8 were maintained without any influence by heat generated in other electronic components and thus without any temperature rise.

As above, the intentionally failed products were maintained at the room temperature without a temperature rise. Note that the lamp of each intentionally failed product went out since the lighting unit 50 stopped operating.

b. Resonant Capacitor C6

Regarding the resonant capacitor C6, the measurement result on the normal product is 110° C., whereas the measurement result on the intentionally failed product is 75° C. Similarly to the coupling capacitors C5 and C8, the capacitor C6 of each intentionally failed product completely shorted out. Thus, the resonant capacitor C6 would no longer generate heat and cause no temperature rise. It should be noted that when a short circuit occurs in the resonant capacitor C6, the lighting unit 50 is brought into a preheating condition and thus causes the filament electrodes to generate heat. Regarding the intentionally failed product, the surface temperature of the resonant capacitor C6 is 75° C. This is assumed to be a result of heat generated in the filament electrodes. Note that when the resonant capacitor C6 shorts out, the voltage across the filament electrodes is reduced and thus the lamp 1 goes out. Operation of the lighting unit 50 finally comes to an end when either of the filament electrode burn out due to the preheating current.

For comparison with foil-type capacitors, FIG. 7 also show the measurement results on lamps having coupling capacitor C5 and C8 of an evaporated-film type. An evaporated-film capacitors breaks down in a short-mode according to which the capacitor after breakdown still has a certain level of resistance (unlike the complete short). This is because of repeated occurrences of self-repairing actions, which is inherent to evaporated-film type capacitors. The discharge energy rustling from the actions melts down and carbonizes the dielectric film.

As a result, a current flow occurs in the coupling capacitors (C5 and C8) and heat is generated. According to FIG. 7, the temperature measured on the coupling capacitors C5 and C8 of each normal product is 100° C., whereas the measurement result on the intentionally failed product exceeds 400° C.

The reason for this is considered to be as follows. Each lighting unit used in the testing has a thermal fuse on the primary of the rectifier/smoothing circuit. Thus, the thermal fuse melted down before the temperature of the coupling capacitors reached the equilibrium state. As a result, the power supply to the lighting unit was shut off and the lamp went out. The surface temperature of the coupling capacitor at this point in time was 400° C. Without the thermal fuse, it is expected that the surface temperature would have been much higher.

As described above, the lamp 1 improves the safety of the lighting unit against heat generated in a heat generating component, as compared with conventional products. Heat operation occurs when, for example, either of the electrodes comes to the end of the useful life. It should be noted, in addition, that the safety improvement is achieved without requiring any additional components and any increase in cost. The capacitor(s) thermally breaks down before discoloration or defamation of the resinous case 30 takes place. Thus, the case 30 is protected from such problems of discoloration and defamation.

Regarding the snubber capacitor C4, it is noted that the withstand voltage of the dielectric film may decrease under adverse influence by heat generated in another electronic component. In such an event, the snubber capacitor C4 may produce a dielectric breakdown. If dielectric breakdown occurs, the snubber capacitor C4 will completely short out and cause no rise in the surface temperature.

That is, there is no risk that the snubber capacitor C4 generates heat after breakdown and causes discoloration or defamation of the case 30. In addition, when the snubber capacitor C4 shorts out, an overcurrent is supplied to the transistor Q2 to cause the transistor Q2 to break down. As a result, operation of the lighting unit 50 is terminated.

Up to this point, the present invention has been described by way of the above embodiment. Yet, it is naturally appreciated that the present invention is not limited to the specific embodiment disclosed above. Various modifications including the following may be made without departing from the gist of the present invention.

1. Modifications to Lamp a. Lamp in General

In the above embodiment, the 12-watt compact self-ballasted fluorescent lamp 1 is described but this is merely by way of example. The type, size and other factors of the lamp are not limited to the specific example above.

In addition, the above embodiment is directed to a lamp having electrodes. That is, the arc tube is made of a glass tube having filament electrodes sealed one at each end thereof. However, the present invention is also applicable to a so-called electrodelees lamp, which uses a dielectric magnetic field.

The present invention is also applicable to a lighting unit for a general-purpose lighting fixture and having an inverter circuit portion. In addition, the present invention is not limited to a lighting circuit for operating a low-pressure mercury discharge lamp and may be applicable to a lighting circuit for operating a high-pressure discharge lamp. The effect achieved by such a lighting circuit is comparable to the effect achieved by the lighting circuit for operating a low-pressure mercury discharge lamp. The sole difference is absence of the effect of causing the filament electrodes of the low-pressure discharge lamp to burn out. The present invention is also applicable to an electronic down-transformer for operating an incandescent lamp with stability as well as to a lighting unit for LEDs.

b. Shape of Arc Tube

Although the above embodiment is directed to a double-spiral arc tube, it goes without saying that the arc tube may have any other shape. For example, the arc tube may have a U-shape made of a single glass tube with a bend, or a so-called "saddle" shape made by further bending a U-bent glass tube. The arc tube may be made of a plurality of, e.g. two or three, U-bent glass tubes connected to one another.

In addition, the double-spiral arc tube may be modified as follows. That is, when the arc tube is in the condition attached to the holder, the filament electrodes disposed within the arc tube are exposed from the holder, instead of being concealed within the holder. In addition, the portions of the arc tube corresponding to the filament electrodes may vertically extend from the holder. Any of the above arc tubes still achieve the comparative effect, except that the effect of reducing heat generation by the electrodes is relatively smaller.

In addition, when the arc tube is composed of a double-spiral glass tube having two spiral portions from the middle thereof toward the respective ends, it means that the end portions of the glass tube wound around an imaginary axis extend along the main surface of the substrate. Thus, the end portions of the glass tube are located at a relatively short distance from the substrate, so that the distance between the substrate and each electrode is relatively smaller. This arrangement allows more prompt transmission of heat generated in the electrodes to a larger number of heat receiving capacitors when the arc tube comes to the end of the useful life. This ensures that circuit operation is terminated safely and promptly.

c. With/Without Globe

The above embodiment is directed to a so-called D type compact self-ballasted fluorescent lamp which is without a globe covering an arc tube. Yet, the present invention is applicable to any compact self-ballasted fluorescent lamps having any other types of globes, including A, T, and G types.

d. Phosphor Layer

The compact self-ballasted fluorescent lamp may have an arc tube of which inner surface is coated with, for example, a tri-band phosphor layer or a phosphor layer that emits light of other wavelengths. In addition, an arc tube may be provided with no phosphor layer.

e. Shape of Case

According to the above embodiment, the case 30 is generally in a funnel-shape having the tapered portion 30c that diametrically diminishes from the side at which the arc tube 10 is attached toward the side at which the base 40 is attached. (Note that the major portion of the lighting unit 50 is located within the tapered portion 30c and the portion covered by the base 40.)

However, the low-pressure mercury discharge lamp according to the present invention is not limited to the one having a funnel-shaped case described in the above embodiment. Alternatively, for example, the case may have a large diameter portion at the arc tube side of the case and a small diameter portion at the base side of the case, so that a step is formed between the two portions.

Responding to the recent demand for miniaturization of lamps, smaller sized lamps have been developed. The present invention meets the demand because the proximity of heat receiving capacitors to heat generating components leads to size reduction of the lighting unit. In addition, the effect of the present invention is achieved more easily and reliably if a heat receiving capacitor is designed to be securely pressed by the inner peripheral wall of the case when attached. With this structure, when the case is attached, the heat generating component is consequently brought into contact with the heat receiving capacitor.

In addition, the effect of the present invention is further ensured by such arrangement of the electronic components that the electrolytic capacitors and resistors, in addition to heat receiving capacitors, are all located within the base. This arrangement increases the density of the electronic components, including the heat receiving capacitors, so that heat is more easily transmitted from the heat generating components to the heat receiving capacitors.

2. Predetermined Conditions

The above embodiment describes that the lamp generates heat when operated under the "predetermined condition" and the predetermined condition is that at least either of the electrodes is approaching the end of its useful life. It is naturally appreciated, however, that the present invention is effective also when the lamp is operated under other conditions that causes an excessive temperature rise.

The following describes examples of other conditions. In one example, a compact self-ballasted fluorescent lamp is mistakenly attached to a lighting fixture capable of a dimmed level operation of an incandescent lamp and operated at a dimmed level. Note that state-of-the-art incandescent lamps are capable of dimmed level operation by phase control. Since compact self-ballasted fluorescent lamps are replacements of incandescent lamps and compact self-ballasted fluorescent lamps bear the name of "lamp", it often happens that a compact self-ballasted fluorescent lamp is mistakenly attached to a lighting fixture with a dimming function.

A lighting unit of a compact self-ballasted fluorescent lamp may be similar to the lighting unit 50 according to the embodiment and includes a rectifying circuit portion having a diode bridge element, an inverter circuit portion having a pair of switching elements, a resonant circuit portion having a choke coil and a resonant capacitor, and a rectifier/smoothing circuit portion having an inrush current limiting resistor at an input end thereof. The inrush current limiting resistor limits an inrush current at the time when power is turned on. With such a lighting unit, the compact self-ballasted fluorescent lamp mistakenly attached to a dimmable illumination fixture often causes malfunction of a dimmer (i.e., a circuit capable of both dimmed-level and full-level operation). Such malfunction occurs even if the lamp is operate at a full-level. If a compact self-ballasted fluorescent lamp is operated with phase control regardless of whether the lamp is operated at a full level as noted above or at a dimmed level, the voltage waveform applied to the rectifier/smoothing circuit portion is distorted. This leads the risk of increasing an input current to the smoothing capacitor.

This is especially problematic if the lighting unit includes an inrush current limiting resistor at an input or output end of the rectifier/smoothing circuit portion. Under such a condition, an excessive current flows through the inrush current limiting resistor, so that the temperature of the inrush current limiting resistor elevates (in this condition, the inrush current resistor acts as a heat generating component).

Because of the recent demand for smaller lamps, it is common that the inrush current limiting resistor is disposed in the vicinity of the case. With this arrangement, heat resulting from the elevated temperatures of the inrush current limiting resistor is likely to causes discoloration of the case. Worse yet, it is reasonably possible that a portion of the case that is close to the inrush current limiting resistor melts.

The lighting unit 50 according to the above embodiment is designed in view of the risk of excessive heat generation by the inrush current limiting resistor P2 that would occur when the lamp is mistakenly operated at a dimmed level. The following description is made with reference to FIGS. 2-6 illustrating the embodiment.

As illustrated in FIG. 5, the inrush current limiting resistor P2 is inserted within a tube and thus provided with covering. The location of the inrush current limiting resistor P2 is in the vicinity of the coupling capacitor C5 and the electrolytic capacitors CD1 and CD2. In this example, the inrush current limiting resistor P2 (a portion of the inrush current limiting resistor P2) is at a location surrounded by the two electrolytic capacitors CD1 and CD2 and the coupling capacitor C5.

Suppose that the lamp 1 having the above structure is mistakenly operated at a dimmed level as described above and thus the temperature of the inrush current limiting resistor P2 excessively increases. In such an event, heat generated in the inrush current limiting resistor P2 is transmitted to the neighboring coupling capacitor C5. When raised to a predetermined temperature, the coupling capacitor C5 breaks down. As a result, the circuit operation is terminated. If a lamp has relatively low rated watts, such as 12 watts, the distance between the inrush current limiting resistor P2 and the coupling capacitor C5 is designed to fall within the range of 0-0.5 mm.

In addition, the distance between the inrush current limiting resistor P2 and at least one of the electrolytic capacitors CD1 and CD2 is set to fall within the range of 0-0.5 mm. The distance is ensured by placing these electronic components (namely, the inrush current limiting resistor P2, the coupling capacitor C5, and the electrolytic capacitors CD1 and CD2) all within the base 40 of the lamp 1.

Suppose that the lamp 1 is mistakenly used with a device having a dimmer and the dimmer repeatedly applies a large pulsed current. In such an event, the inrush current limiting resistor P2 generates abnormally high heat and is raised to around 400° C.

The following experiment was conducted on samples of the lamp 1. Regarding each sample, the inrush current limiting resistor P2, the coupling capacitor C5, the electrolytic capacitors CD1 and CD2 were all located within the base 40. In addition, the distance between the inrush current limiting resistor P2 and the electrolytic capacitors CD1 and CD2 was 0.1 mm. In the experiment, the inrush current limiting resistor P2 was caused to abnormally generate high heat. As a result, the electrolytic capacitors CD1 and CD2 underwent an abrupt temperature rise because of the heat generated in the inrush current limiting resistor P2. In ten minutes or so, the temperature of the electrolytic capacitors CD1 and CD2 exceeded 150° C. Eventually, the capacitance of the electrolytic capacitors CD1 and CD2 significantly reduced and the circuit oscillation stopped.

Another experiment was conducted on samples of the lamp 1. Similarly to the above samples, the inrush current limiting resistor P2, the coupling capacitor C5, the electrolytic capacitors CD1 and CD2 were located within the base 40. The distance between the inrush current limiting resistor P2 and the coupling capacitor C5 was 0.5 mm. Similarly to the above experiment, the inrush current limiting resistor P2 generated heat and the heat caused to raise the temperate of the coupling capacitor C5 higher than 200° C. in twenty minutes or so. One to two minutes after the temperature rise, the coupling capacitor C5 broke down in the short-mode and oscillation stopped.

When the coupling capacitor C5 breaks down in the short-mode, it is normally expected that a typical self-excited oscillator circuit as illustrated in FIG. 2 stops oscillating. However, on rare occasion, a current flow remains in the circuit after the breakdown. Yet, it is ensured that the current flow does not cause an excessive temperature rise of the coupling capacitor C5.

3. Heat Generating Components & Heat Receiving Capacitors a. Combinations

Among the electronic components included in the lamp 1 according to the embodiment and modification 2 described above, electronic components that would act as heat generating components when either electrode comes to the end of its useful life include the transistors Q1 and Q2, the positive temperature coefficient element PTC, the choke coil L, the electrolytic capacitors CD1 and CD2. Electronic components that would act as heat generating components when the lamp is misused (i.e., operated at a dimmed level) include the inrush current limiting resistor P2, the choke coil L, and the electrolytic capacitors CD1 and CD2. Yet, these electronic components are cited merely by way of example. Depending on the operating condition of the lamp, other electronic components may also act as heat generating components.

In addition, the combinations of the heat generating components and the heat receiving capacitors described in the above embodiment and modification are merely examples and any other combination is possible. Furthermore, the embodiment and modification both describe that each heat generating component is in contact with or in the vicinity of at least one heat receiving capacitor. The contact between a heat generating component and a heat receiving capacitor may be made directly or via a heat conductive material such as silicon or wax.

Furthermore, the heat receiving capacitor may be formed into a film-sheet and disposed to cover a heat generating component. This structure makes it possible to prevent abnormal heat generated locally by a heat generating component. The heat receiving capacitor may be disposed to cover a plurality of heat generating components. Here, the heat receiving capacitor may be made integrally with the heat generating components to achieve higher effect. In addition, the film-sheet may be provided in any number of layers and the electrode leads may be formed of extended portions of the metal foil. Furthermore, the film-sheet may be welded to the lead wires or crimped to the lead wires by thermal spraying. As a result of the thermal spraying, the portions of the film-sheet sprayed increase in contact resistance. In some occasions, the resulting resistance may be approximately 10Ω or less. Yet, since the resulting film-sheet causes a short between foils, an effect comparable to that of the foil-type capacitors is archived.

In addition, the heat receiving capacitor may be disposed in contact with or in the vicinity of a capacitor other than a foil-type capacitor, such as a ceramic capacitor or metallized film capacitor. This arrangement still achieves a comparable effect.

More specifically, ceramic capacitors are prone to break when distortion is caused by external pressure or voltage and often have a residual resistance after breakdown. Similarly, metallized film capacitors and the like tend to hold residual resistance after breakdown by high voltage or high temperature.

Since the electrode portions of such a capacitor have been thermally sprayed, poor contact may occur between a evaporated film and a lead wire. The portion of the evaporated film where the poor contact is made has resistance and thus tends to generate heat. This often occurs at the initial and end periods of the lamp life.

If a heat generating component is connected to a heat receiving capacitor in parallel, a current is made to bypass when the heat generating component generates abnormally high heat. As a result, the heat generation is terminated.

The following more specifically describes the example mentioned above. According to the above embodiment, the resonant capacitor C6 is disposed in the vicinity of the positive temperature coefficient element PTC. Alternatively, the resonant capacitor C6 may be disposed in contact with or in the vicinity of, for example, one of the choke coil and the transistors. Furthermore, although the above embodiment describes that the snubber capacitor C4 is disposed in the vicinity of the transistor Q1, the snubber capacitor C4 may be disposed in contact with or in the vicinity of, for example, one of the positive temperature coefficient element and the choke coil. Furthermore, although the above modification describes that the inrush current limiting resistor P2 is disposed in the vicinity of the coupling capacitor C5, the inrush current limiting resistor P2 may be disposed in contact with or in the vicinity of, for example, one of the coupling capacitor (C8), the snubber capacitor, and the resonant capacitor.

As described above, the lamp operation under the predetermined condition according to the present invention refers to operation of the lamp when at least either of the electrodes is at the end of the useful life or operation of the lamp mistakenly at a dimmed level. In addition, the lamp operation under the predetermined condition also refers to operation of the lamp mistakenly attached to an illumination fixture for operating a high intensity discharge lamp. Generally, a high intensity discharge lamp has a base that is similar in specification to a base (specifically, E-26 base) of a compact self-ballasted fluorescent lamp.

The present invention is also effective when an electronic component of the lighting unit generates abnormally high heat due to errors in an electrical system. Such errors often occur when the neutral conductor (i.e., earth wire) burns out, when a phase-control type power-factor corrector is provided, or when a number of inductance components are included and thus a switching surge or inductive surge tend to occur.

Experiments and life tests were conducted under the predetermined conditions described above. The predetermined conditions are: where the resonant capacitor C6 is disposed in contact with or in the vicinity of one of the choke coil and the transistors; where the snubber capacitor C4 is disposed in contact with or in the vicinity of one of the positive temperature coefficient element and the choke coil; where the inrush current limiting resistor P2 is disposed in contact with or in the vicinity of one of the coupling capacitor (C8), the snubber capacitor, and the resonant capacitor; the predetermined lamp operation conditions (dimmed level operation or operation with a wrong illumination fixture); and the above-mentioned conditions regarding the electrical system. It is described above that a heat generating component is disposed in contact with or in the vicinity of a heat receiving capacitor. As a result of the experiments and the life tests, regarding low-watt lamps such as 12-watt lamps, it is determined that the effect of the present invention is achieved as long as the distance L between the heat generating component and the heat receiving capacitor is 2.5 mm or less. Yet, there may be some delay in occurrence of the breakdown.

It is also confirmed that as long as the distance L between a heat generating component and a heat receiving capacitor falls within the range of 0.1-0.5 mm, the temperature of the heat receiving capacitor under a normal operation is maintained low. Yet, it is ensured that the heat receiving capacitor shorts out without delay upon occurrence of an abnormal event at the end of lamp life.

It is also confirmed that if a heat generating component is disposed in contact with a heat receiving capacitor, the heat receiving capacitor breaks down without delay.

In addition, the lamp having the above structure may be further modified to adjust the temperature of a heat receiving capacitor under normal operation, so that the rated life hours of the heat receiving capacitor is shorter than the rated life hours of the arc tube 10 of the lamp 1. With this arrangement, the rated life of the lamp 1 is made equal (approximately equal) to the rated life of the heat receiving capacitor. This ensures that the lamp is brought to the end of its useful life more safely.

b. Number of Components

According to the above embodiment, one heat generating component is disposed in the vicinity of one heat receiving capacitor. Yet, it is applicable that one heat generating component is in contact with or in the vicinity of two or more heat receiving capacitors. Alternatively, a plurality of heat generating components may be disposed in contact with or in the vicinity of one heat receiving capacitor.

When disposing a plurality of heat generating components at locations relative to one heat receiving capacitor, it is desirable that the heat generating components are disposed to surround the choke coil and the heat receiving capacitor is disposed to span the plurality of heat generating components. In addition, it is desirable that the heat receiving capacitor is disposed at a location opposed to the choke coil relative to the heat generating component.

c. Number of Combinations

As described above in the embodiment and the modification 2, which and how many of the electronic components act as heat generating components differ depending on the conditions. That is, at the end of electrode's life, the switching elements (transistors) Q1 and Q2, the choke coil L, and the positive temperature coefficient element PTC act as heat generating components. When the lamp is operated at a dimmed level by error, the inrush current limiting resistor P2 and the electrolytic capacitors CD1 and CD2 act as the heat generating components.

As clarified above, which and how many of the electronic components act as the heat generating components differ depending on the conditions. In the case where a plurality of electronic components possibly act as heat generating components, it is desirable that a maximum number of such electronic components are disposed in contact with or in the vicinity of one or more of heat receiving capacitors. More specifically, it is desirable that each electronic component that may act as a heat generating component is disposed in contact with or in the vicinity of one or more of heat receiving capacitors. Such arrangement more reliably improves the safety of the lighting unit.

d. Electrolytic Capacitors

According to the above embodiment, the rectifier/smoothing circuit portion 100, for example, is provided with aluminum electrolytic capacitors CD1 and CD2 as smoothing capacitors. Since the electrolytic capacitors use an electrolytic solution, the electrolytic capacitors are vulnerable to high temperatures. In addition, the equivalent series resistance of the electrolytic capacitors is high and thus involves relatively high self-heating. Under normal operation of the lamp, the electrolytic capacitors are raised to 3° C. to 10° C. Upon application of an abnormal voltage, the electrolytic capacitors are raised to the extent of 20° C.-80° C. Thus, the electrolytic capacitors may possibly act as heat generating components.

4. Capacitors

According to the above embodiment, the circuit portions (especially, the inverter circuit portion) is provided with foil-type capacitors. Yet, the capacitors may be of other types. More specifically, one of the coupling capacitors C5 and C8, the starting capacitor C3, and the snubber capacitor C4 may be a capacitor other than a foil-type capacitor.

A capacitor other than a foil-type capacitor may generate excessive heat. Yet, the starting capacitor C3 is free from the risk of excessive heat generation even if the capacitor is not of a foil-type. This is because the voltage applied to the starting capacitor C3 is 40 V or less under normal operation, and 20 V or so after the starting capacitor C3 breaks down. In addition, since high resistors are connected in series as illustrated in FIG. 2, a current flowing through the starting capacitor C3 is relatively small. Yet, if the diode D4 is mistakenly connected to low resistors in series, the starting capacitor C3 does generate a small amount of heat. In view of this, a capacitor other than a foil-type capacitor may act as a heat generating component.

One or more of the capacitors C3-C8 may be disc-shaped ceramic capacitors, metallized polyester capacitors, metallized polypropylene capacitors, or combinations of metallized polypropylene capacitor and metallized polyester capacitor. In addition, chip ceramic capacitors may be used.

5. Circuit Structure

According to the above embodiment, the inverter circuit is of a half-bridge type. Yet, an inverter circuit of any other type may be used. Examples of other types of inverter circuits includes series inverter, single-switch inverters, L-push-pull inverters, inverters that restrain higher harmonics, full-bridge inverters, and choppers.

According to the embodiment and the modification 2 above, a heat receiving capacitor disposed in the vicinity of a heat generating component is a foil-type film capacitor. Yet, it is naturally appreciated that foil-type capacitors may be employed as film capacitors other than the heat receiving capacitors.

In addition, according to the embodiment and modification, bipolar transistors are employed as the switching elements. Yet, the switching elements may be constructed with other electronic components, such as FETs.

INDUSTRIAL APPLICABILITY

The present invention is applicable for a lighting unit and a discharge lamp each of which ensures that a capacitor is caused to break down by heat from a heat generating component. As a result of the capacitor breakdown, the circuit operation is safely terminated or brought into a safe condition.

The invention claimed is:

1. A lighting unit having a circuit composed of a plurality of electronic components for operating a low-pressure discharge lamp having filament electrodes, wherein
the circuit includes:
a rectifier/smoothing circuit portion having a smoothing capacitor;
an inverter circuit portion having a switching element;
a resonance circuit portion having a foil-type resonance capacitor, and
a preheating circuit portion having a positive temperature coefficient element configured to preheat one or both of the electrodes at startup of the low-pressure discharge lamp,
the plurality of electronic components are mounted on a substrate and include one or more heat receiving capacitors and one or more heat generating components,
each heat receiving capacitor is configured to (i) perform a predetermined function during normal lamp operation and (ii) break down when raised to a predetermined temperature or higher responsive to heat from another of the electronic components, so that lamp operation is terminated or abnormal heat generation in said another electronic component is eliminated,
each heat generating component is configured to undergo an excessive temperature rise when the lamp is operated under a predetermined condition, and
one of the heat receiving capacitors is the resonance capacitor,
one of the heat generating components is the positive temperature coefficient element configured to undergo a temperature rise when the low-pressure discharge lamp is operated under the predetermined condition that either of the electrodes is at an end of life,
the resonance capacitor is connected in parallel to the preheating circuit portion and is disposed on the substrate at a position that is (i) close to or in contact with the positive temperature coefficient element and (ii) positioned nearer to a peripheral edge of the substrate than the positive temperature coefficient element, so that the resonance capacitor breaks down in a short-mode when raised to the predetermined temperature or higher.

2. The lighting unit according to claim 1, wherein
the preheating circuit portion has a foil-type auxiliary capacitor serially connected to the positive temperature coefficient element, and
the auxiliary capacitor is disposed on the substrate at a position near an edge of the substrate.

3. The lighting unit according to claim 1, wherein
the inverter circuit portion includes a choke coil,
the choke coil is one of the heat generating components configured to undergo a temperature rise when the discharge lamp is operated under the predetermined condition that electrode of the lamp is at the end of life,
the choke coil is disposed generally centrally of the substrate, and
the positive temperature coefficient element is disposed on the substrate at a position between the choke coil and the recurrence capacitor.

4. A low-pressure discharge lamp comprising:
an arc tube;
a lighting unit configured to operate the arc tube;
a tubular case configured to hold the arc tube and to house the lighting unit therein; and
a base attached to an opposite end of the case from an end at which the arc tube is held, wherein
the lighting unit is as defined in claim 3.

5. The lighting unit according to claim 1, wherein
the inverter circuit portion includes a foil-type snubber capacitor configured to protect the switching element,
one of the heat receiving capacitors is the snubber capacitor, and
the snubber capacitor is located near an edge of the substrate.

6. The lighting unit according to claim 5, wherein
the inverter circuit portion includes a choke coil,
the choke coil is one of the heat generating components configured to undergo a temperature rise when the discharge lamp is operated under the predetermined condition that electrode of the lamp is at the end of life,
the inverter circuit portion includes at least two switching elements in total, and
the snubber capacitor is disposed close to or in contact with at least one of the switching elements, and said at least one switching element being disposed on the substrate at a position between the choke coil and the snubber capacitor.

7. The lighting unit according to claim 1, wherein
the inverter circuit portion is of a half-bridge type having a pair of coupling capacitors, and
at least one of the heat receiving capacitors is one of the coupling capacitors.

8. The lighting unit according to claim 1, wherein
the smoothing capacitor is an electrolytic capacitor for smoothing, and
at least one of the heat receiving capacitors is disposed close to or in contact with the electrolytic capacitor.

9. The lighting unit according to claim 1, wherein
the inverter circuit portion includes another capacitor that is not of a foil-type, and
at least one of the heat receiving capacitors is disposed close to or in contact with said another capacitor.

10. The lighting unit according to claim 1, wherein
the circuit includes an inrush current limiting resistor, and
at least one of the heat receiving capacitors is disposed close to or in contact with the inrush current limiting resistor.

11. The lighting unit according to claim 1, wherein
the heat receiving capacitors are connected in parallel to a power source or to output after rectification or smoothing.

12. A low-pressure discharge lamp comprising:
an arc tube;
a lighting unit configured to operate the arc tube;
a tubular case configured to hold the arc tube and to house the lighting unit therein; and
a base attached to an opposite end of the case from an end at which the arc tube is held, wherein
the lighting unit is as defined in claim 1.

13. The low-pressure discharge lamp according to claim 12, wherein
the arc tube is made of a glass tube having a double-spiral shape.

14. The low-pressure discharge lamp according to claim 12, wherein
in the lighting unit, each heat receiving capacitor that is disposed close to or in contact with at least one of the heat generating components is located between the case and said at least one of the heat generating components.

15. A low-pressure discharge lamp comprising:
an arc tube;
a lighting unit configured to operate the arc tube;
a tubular case configured to hold the arc tube and to house the lighting unit therein; and
a base attached to an opposite end of the case from an end at which the arc tube is held, wherein
the lighting unit is as defined in claim 1.

16. The lighting unit according to claim 1 wherein an auxiliary capacitor is connected in series with the positive temperature coefficient element and is physically disposed on the surface of the substrate, at a position that is close to or in contact with the positive temperature coefficient element and on an opposite side of the positive temperature coefficient element from the resonance capacitor.

17. The lighting unit according to claim 16 wherein the auxiliary capacitor is positioned nearer to the peripheral edge of the substrate than the positive temperature coefficient element so that the auxiliary capacitor breaks down in a short-mode when raised to the predetermined temperature or higher.

* * * * *